US007776752B2

(12) United States Patent
Kwon et al.

(10) Patent No.: US 7,776,752 B2
(45) Date of Patent: Aug. 17, 2010

(54) METHOD OF ETCHING FOR MULTI-LAYERED STRUCTURE OF SEMICONDUCTORS IN GROUP III-V AND METHOD FOR MANUFACTURING VERTICAL CAVITY SURFACE EMITTING LASER DEVICE

(75) Inventors: O Kyun Kwon, Daejeon (KR); Mi Ran Park, Daejeon (KR); Won Seok Han, Daejeon (KR); Hyun Woo Song, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/635,223

(22) Filed: Dec. 7, 2006

(65) Prior Publication Data

US 2007/0134926 A1  Jun. 14, 2007

(30) Foreign Application Priority Data

Dec. 8, 2005  (KR) ............... 10-2005-0120081
Mar. 28, 2006  (KR) ............... 10-2006-0027972

(51) Int. Cl.
*H01L 21/302* (2006.01)

(52) U.S. Cl. ............... 438/718; 257/E21.218; 257/E21.22

(58) Field of Classification Search ............... 438/718; 257/E21.218, E21.22
See application file for complete search history.

(56) References Cited

U.S. PATENT DOCUMENTS

| 4,742,026 | A | | 5/1988 | Vatus et al. | |
| 4,925,813 | A | * | 5/1990 | Autier et al. | 438/718 |
| 5,304,514 | A | * | 4/1994 | Nishibe et al. | 438/713 |
| 5,474,652 | A | | 12/1995 | Henderson et al. | |
| 5,616,213 | A | * | 4/1997 | Henderson et al. | 438/718 |
| 5,624,529 | A | * | 4/1997 | Shul et al. | 438/718 |
| 6,057,567 | A | * | 5/2000 | Bayraktaroglu | 257/197 |
| 2001/0025826 | A1 | * | 10/2001 | Pierson et al. | 216/55 |
| 2004/0155260 | A1 | * | 8/2004 | Kuzmik | 257/192 |
| 2007/0127533 | A1 | * | 6/2007 | Yoo et al. | 372/50.1 |

FOREIGN PATENT DOCUMENTS

| JP | 2004-281815 | 10/2004 |
| KR | 1020020041333 | 6/2002 |
| KR | 1020040035729 | 4/2004 |
| WO | WO 03-015185 | 2/2003 |

OTHER PUBLICATIONS

Jeff E. Schramm et al; "Fabrication of high-aspect-ratio InP-based vertical-cavity laser mirrors using $CH_4/H_2/O_2/Ar$ reactive ion etching" J. Vac. Sci. Technol. B vol. 15; No. 6; Nov./Dec. 1997.
J.H. Shin et al; "Reactive ion etchng of InAlAs and InAlGaAs with $BCl_3/Cl_2/CH_4/H_2$ mixtures for long wavelength VCELs"; Electronics Letters Mar. 16, 2000, vol. 36, No. 6.

* cited by examiner

*Primary Examiner*—Hsien-ming Lee
*Assistant Examiner*—Kevin Parendo
(74) *Attorney, Agent, or Firm*—Ladas & Parry LLP

(57) ABSTRACT

Provided are an etching method for a multi-layered structure of semiconductors in groups III-V and a method of manufacturing a VCSEL using the etching method. According to the etching method, a stacked structure including a first semiconductor layer and a second semiconductor layer is exposed to a plasma of a mixture consisting of $Cl_2$, Ar, $CH_4$, and $H_2$ to etch the stacked structure, so that a mirror layer of the VCSEL is formed. The first semiconductor layer is formed of a semiconductor in groups III-V and the second semiconductor layer is formed of a semiconductor in groups III-V, other than the semiconductor of the first semiconductor layer. At least part of a lower mirror layer, a lower electrode layer, an optical gain layer, an upper electrode layer, and an upper mirror layer is etched using one time of an etching process, so that a clean and smooth etched surface is obtained.

8 Claims, 3 Drawing Sheets

METHOD OF ETCHING FOR MULTI-LAYERED STRUCTURE OF SEMICONDUCTORS IN GROUP III-V AND METHOD FOR MANUFACTURING VERTICAL CAVITY SURFACE EMITTING LASER DEVICE

CROSS-REFERENCE TO RELATED PATENT APPLICATION

This application claims the benefits of Korean Patent Application No. 10-2005-0120081, filed on Dec. 8, 2005, and Korean Patent Application No. 10-2006-0027972, filed on Mar. 28, 2006, in the Korean Intellectual Property Office, the disclosures of which are incorporated herein in their entirety by reference.

BACKGROUND OF THE INVENTION

1. Field of the Invention

The present invention relates to manufacturing of a semiconductor laser, and more particularly, to an etching method for a multi-layered structure of semiconductors in groups III-V for manufacturing a surface emitting laser device (SEL), and a method of manufacturing a vertical cavity surface emitting laser device (VCSEL) using the etching method.

2. Description of the Related Art

Since an SEL has a low threshold current contrary to conventional edge-emitting laser diodes, and has a circular beam shape, the SEL has high optical fiber coupling efficiency and thus represents excellent device characteristics. Also, since the SEL is easy to manufacture as a device of a two-dimensional array, and can be tested while the SEL is still in a wafer state, the SEL has mass production characteristics of conventional electronic devices. Therefore, the SEL is currently under development as a promising device capable of replacing conventional optical devices in the fields of an optical communication network and optical sensors with its excellent performance and low manufacturing costs.

To manufacture the SEL, a mirror layer having high reflectance is required, and a material of high optical gain is required. Particularly, when a laser ray is used, different wavelengths should be used depending on applications, and accordingly, effective combination of materials should be considered according to respective wavelengths. For example, an SEL for a wavelength band 850 nm has been successfully commercialized by providing a GaAs substrate, a semiconductor mirror layer of high reflectance and an active layer of a high gain material using combination of GaAs/AlGaAs, and by providing excellent thermal characteristics.

However, in case of wavelength bands of 1.3 μm and 1.5 μm mainly used for communication, there is much difficulty in using the combination of GaAs/AlGaAs. Therefore, an InP substrate and one of InGaAsP or InAlGaAs are mainly used. However, in this case, growing of a large number of layers is required to obtain high reflectance. Also, quaternary materials such as InGaAsP and InAlGaAs have one tenth lower thermal conductivities than those of binary materials such as GaAs, that is, the quaternary materials have very low conductivities, which limits device characteristics.

Therefore, various methods have been proposed to overcome these problems and develop SELs for a long wavelength band. Particularly, many attempts have been made to solve a thermal characteristic deterioration problem raised when quaternary materials are used. For example, a technology has been proposed to use a mirror layer of InAlGaAs/InP instead of a conventional quaternary material InAlGaAs/InAlAs. This technology allows reducing a growth thickness using a relatively large refractive index difference and obtaining an excellent thermal characteristic from high thermal conductivity. However, even in this case, a dry etching process of a thickness of about 10 μm is still required to manufacture a desired device. When the dry etching process required herein is performed, a reaction gas in a $Cl_2$—Ar group has been used as an etching gas in a related art. However, when this reaction gas is used, etching conditions are complicated and it is difficult to obtain a smooth etched surface after an etching process is completed. Particularly, InAlGaAs is effectively etched using a reaction gas in a $Cl_2$—Ar group, but when InP is etched using a reaction gas in a $Cl_2$—Ar group, a rough etched surface is obtained and etch stop may be generated by etching by-product. Accordingly, InP may be etched using a gas $CH_4$—$H_2$. However, when a gas $CH_4$—$H_2$ is used, an etching speed of InAlGaAs becomes too slow, which generates another problem. Also, an attempt has been made to use an etching gas where $BCl_3$ is added to $CH_4$—$H_2$ in a related art, but $BCl_3$ exists in a liquid state and thus it is difficult to deal with. Also, a separate apparatus for evaporating liquid state $BCl_3$ is required in order to swiftly supply $BCl_3$ into an etching chamber, which complicates a process equipment and increases manufacturing costs.

SUMMARY OF THE INVENTION

The present invention provides an etching method for a multi-layered structure of semiconductors in groups III-V, capable of increasing reliability of SEL by providing a uniform etching speed and a smooth etched surface when etching a semiconductor multi-layered structure in which at least two kinds of compound semiconductor layers consisting of materials in groups III-V are alternately stacked for manufacturing of SEL.

The present invention also provides a method of manufacturing a VCSEL, capable of providing high reliability by providing a mirror layer consisting of a multi-layered structure semiconductor layer having a smooth etched surface through a simple etching process, and of achieving high reliability, high efficiency and long wavelength through a simplified process of simultaneously etching a plurality of layers having various functions using one time of an etching process.

According to an aspect of the present invention, there is provided an etching method for a multi-layered structure of semiconductors in groups III-V, the method including performing etching by exposing a stacked structure including a first semiconductor layer formed of a semiconductor in groups III-V and a second semiconductor layer formed of a semiconductor in groups III-V other than the semiconductor of the first semiconductor layer, to a plasma of a mixture consisting of $Cl_2$, Ar, $CH_4$, and $H_2$.

Each of the first semiconductor layer and the second semiconductor layer may be formed of one material selected from the group consisting of GaAs, AlAs, AlGaAs, InAlAs, InAlGaAs, InGaAs, InGaAsP, InAlGaP, InGaP, and InP.

The mixture may consist of $Cl_2$ of about 1-99 volume %, Ar of about 1-99 volume %, $CH_4$ of about 1-99 volume %, and $H_2$ of about 1-99 volume %, based on the total volume of the mixture. A volume ratio of $Cl_2$ to Ar in the mixture may be 1:1, and a volume ratio of $CH_4$ to $H_2$ in the mixture may be 5:2. Also, the total volume of $Cl_2$ and Ar may be the same as that of $CH_4$ and $H_2$.

According to another aspect of the present invention, there is provided a method of manufacturing a VCSEL, the method including: forming a stacked structure including a plurality of semiconductor layers formed of different materials in groups III-V on a substrate; forming a mask pattern on the stacked structure to expose part of the stacked structure; and exposing the exposed part of the stacked structure to a plasma of a mixture consisting of $Cl_2$, Ar, $CH_4$, and $H_2$ using the mask pattern as an etch mask to etch the exposed part of the stacked structure to a predetermined thickness.

The plurality of semiconductor layers may include a lower mirror layer, a lower electrode layer, an optical gain layer, an upper electrode layer, and an upper mirror layer sequentially formed on the substrate. At this point, the etching etches at least part of the lower mirror layer, the lower electrode layer, an optical gain layer, an upper electrode layer, and an upper mirror layer.

For example, each of the lower mirror layer and the upper mirror layer may be formed of a stacked structure in which an InP layer and an InAlGaAs layer are alternately stacked a predetermined number of times.

According to the present invention, it is possible to obtain a very clean and smooth etched surface by exposing a compound semiconductor layer of a multi-layered structure formed of semiconductors in groups III-V to a plasma of a mixture consisting of $Cl_2$, Ar, $CH_4$, and $H_2$ when etching the semiconductor layer relatively deep. Therefore, improved mass production of SEL may be achieved, manufacturing costs may be reduced, and thermal characteristic of SEL may improve, so that a device of high reliability may be realized.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
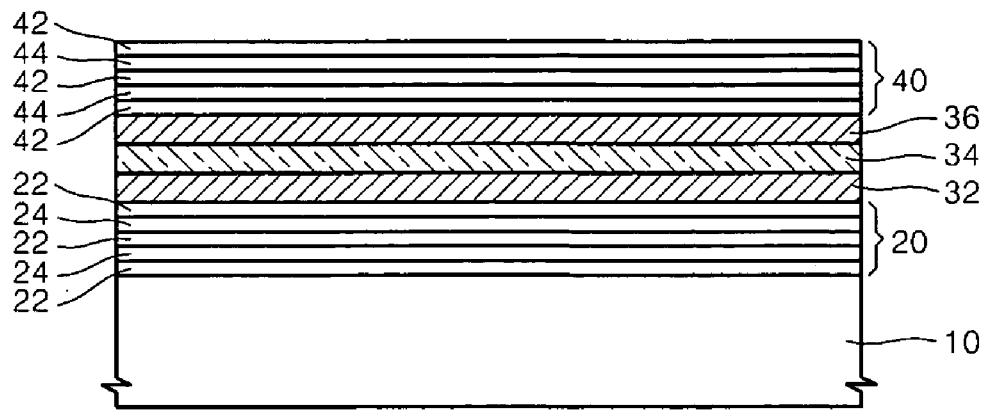
FIGS. 1 through 4 are sectional views illustrating processes of a method of manufacturing a VCSEL according to an embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals in the drawings denote like elements, and thus their description will be omitted.

FIGS. 1 through 4 are sectional views illustrating processes of a method of manufacturing a VCSEL according to an embodiment of the present invention.

Referring to FIG. 1, a lower mirror layer 20 is formed on a semiconductor substrate 10 made of InP. The lower mirror layer 20 has a structure in which two semiconductor materials of different refractive indices are alternately grown. In detail, the lower mirror layer 20 has a multi-layered stacked structure in which a first semiconductor layer 22 formed of a semiconductor in groups III-V and a second semiconductor layer 24 formed of another semiconductor in groups III-V, other than the semiconductor of the first semiconductor layer 22 are alternately stacked a predetermined number of times. Each of the first semiconductor layer 22 and the second semiconductor layer 24 may be formed of one material selected from the group consisting of GaAs, AlAs, AlGaAs, InAlAs, InAlGaAs, InGaAs, InGaAsP, InAlGaP, InGaP, and InP. For example, the first semiconductor layer 22 and the second semiconductor layer 24 contained in the lower mirror layer 20 may be formed of InP and InAlGaAs, respectively. To form an SEL for 1.3 µm, the lower mirror layer 20 requires about fifty pairs of layers, each pair consisting of the first semiconductor layer 22 and the second semiconductor layer 24.

A lower electrode layer 32, an optical gain layer 34, and an upper electrode layer 36 are sequentially formed on the lower mirror layer 20. Each of the lower electrode layer 32 and the upper electrode layer 36 may be formed of InP, and the optical gain layer 34 may be formed of InP/InAlGaAs.

An upper mirror layer 40 is formed on the upper electrode layer 36. Like the lower mirror layer 20, the upper mirror layer 40 has a structure in which two semiconductor materials of different refractive indices are alternately grown. In detail, the upper mirror layer 40 has a multi-layered stacked structure in which a third semiconductor layer 42 formed of a semiconductor in groups III-V and a fourth semiconductor layer 44 formed of another semiconductor in groups III-V, other than the semiconductor of the third semiconductor layer 42 are alternately stacked a predetermined number of times.

Each of the third semiconductor layer 42 and the fourth semiconductor layer 44 may be formed of one material selected from the group consisting of GaAs, AlAs, AlGaAs, InAlAs, InAlGaAs, InGaAs, InGaAsP, InAlGaP, InGaP, and InP. For example, the third semiconductor layer 42 and the fourth semiconductor layer 44 contained in the upper mirror layer 40 may be formed of InP and InAlGaAs, respectively. To form an SEL for 1.3 µm, the upper mirror layer 40 requires about thirty pairs of layers, each pair consisting of the third semiconductor layer 42 and the fourth semiconductor layer 44.

Figure 2:
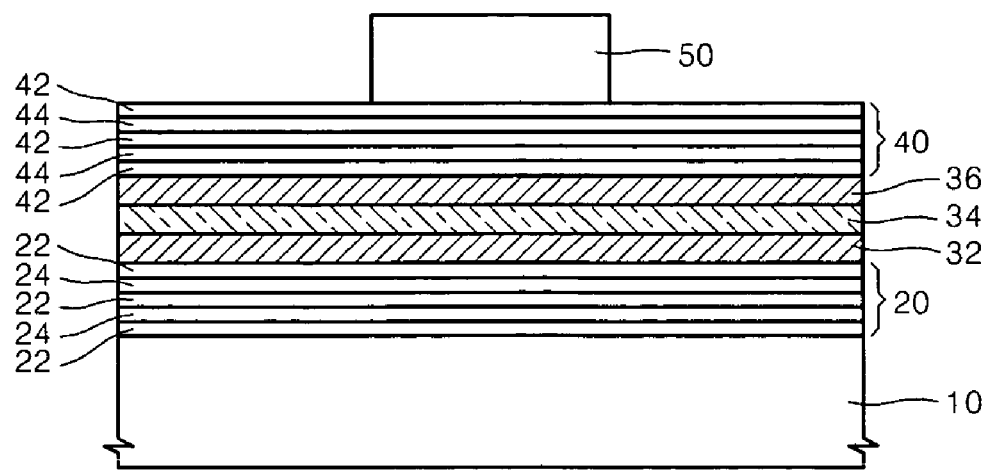

Referring to FIG. 2, a mask pattern 50 covering a predetermined region of the upper surface of the upper mirror layer 40 is formed on the upper mirror layer 40. The mask pattern 50 may be formed of metal, a metal oxide, a dielectric, or a photoresist.

Figure 3:
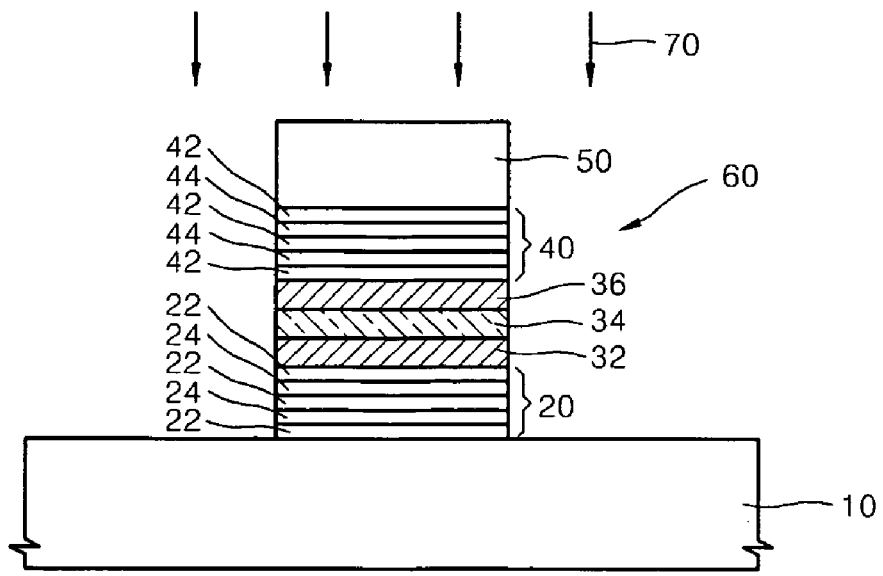

Referring to FIG. 3, a portion of the upper mirror layer 40 that is exposed through the mask pattern 50 and structures under the exposed upper mirror 40 are dry-etched to a desired depth by reactive ion etching or reactive ion beam etching using the mask pattern 50 as an etch mask to form a mesa structure 60. At this point, for the dry etching, the structure on which the mask pattern 50 is formed is exposed to an etching gas 70 consisting of a mixed gas plasma containing $Cl_2$, Ar, $CH_4$, and $H_2$.

Referring to FIG. 1, each unit device should be electrically isolated using the etching gas 70 in order to manufacture a unit device from a stacked structure formed of a plurality of semiconductor growth layers. For this purpose, the stacked structure should be removed by at least a thickness of 7 µm through etching that uses the etching gas 70. It is possible to form the mesa structure 60 having a clean and smooth etched surface even when a relatively large thickness greater than 10 µm is etched by etching the stacked structure using the etching gas 70 consisting of a mixed gas plasma containing $Cl_2$, Ar, $CH_4$, and $H_2$ according to a method of the present invention.

A mixture constituting the etching gas 70 may consist of $Cl_2$ of about 1-99 volume %, Ar of about 1-99 volume %, $CH_4$ of about 1-99 volume %, and $H_2$ of about 1-99 volume %, based on the total volume of the etching gas 70. A volume ratio of $Cl_2$ to Ar in the mixture may be 1:1, and a volume ratio of $CH_4$ to $H_2$ may be 5:2. Also, for example, the total volume of $Cl_2$ and Ar may be the same as that of $CH_4$ and $H_2$.

The etching using the etching gas 70 may be performed under a pressure range of about 1-100 mTorr, also under a pressure range of about 1-20 mTorr, and particularly, under a pressure range of about 10 mTorr. Also, the etching may be performed at a plasma power density range of about 0.1-5 Watt/cm², also at a plasma power density range of about 0.5-1.5 Watt/cm², and particularly, at a plasma power density range of about 1 Watt/cm². Also, the etching may be performed at a temperate range of about 0-150° C.

Although FIG. 3 illustrates an example in which etching is performed up to the lower mirror layer 20 using the mask pattern 50 as an etch mask in order to form the mesa structure 60, the present invention is not limited to this particular example. That is, the etching may be performed to a desired depth depending on the structure and design of a device.

Figure 4:
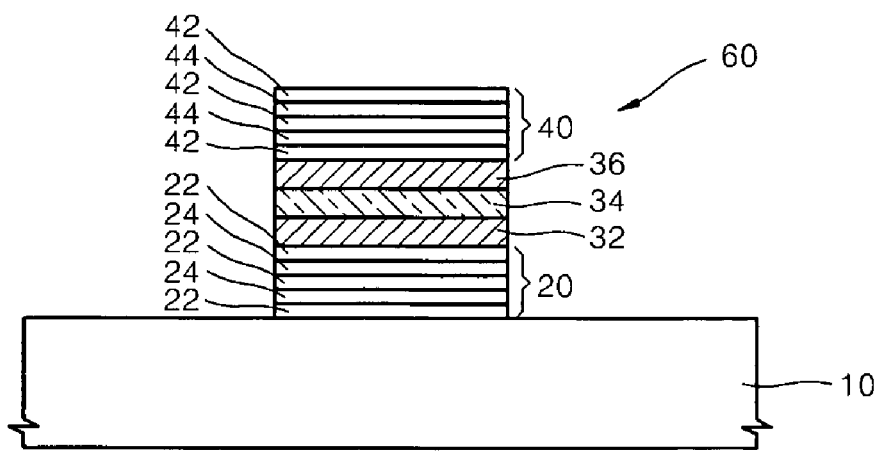

Referring to FIG. 4, the mask pattern 50 is removed, and a general process is performed to complete a laser device of a desired structure.

A method of manufacturing an SEL according to the present invention adopts a mirror layer formed by alternately stacking two kinds of semiconductor layers, each layer being formed of one material selected from the group consisting of GaAs, AlAs, AlGaAs, InAlAs, InAlGaAs, InGaAs, InGaAsP, InAlGaP, InGaP, and InP, and particularly, a mirror layer formed of a multi-layer of InP/InAlGaAs. Therefore, a relative large difference in a refractive index may reduce a growth thickness. Also, an excellent mirror characteristic and excellent thermal conductivity characteristic of InP may improve a thermal characteristic during manufacturing of a device. Also, it is possible to obtain a very uniform and smooth etched surface by etching the structure formed by alternately stacking two kinds of semiconductor layers, each layer being formed of one material selected from the group consisting of GaAs, AlAs, AlGaAs, InAlAs, InAlGaAs, InGaAs, InGaAsP, InAlGaP, InGaP, and InP, and particularly, a mirror layer formed of a multi-layer of InP/InAlGaAs using a mixed gas plasma containing $Cl_2$, Ar, $CH_4$, and $H_2$. Also, it is possible to obtain a device of high reliability and high stability through an easy and stable etching process.

Evaluation Example 1

Etching has been performed in various ways on a variety of structures in order to evaluate effect of an etching method for a multi-layered structure of semiconductors in groups III-V according to the present invention.

Table 1 shows measurement results of an etching rate obtained when various material layers are etched using a mixed gas plasma containing $Cl_2$, Ar, $CH_4$, and $H_2$ according to an etching method according to the present invention. Here, in order to obtain the result of Table 1, $Cl_2$, Ar, $CH_4$, and $H_2$ have been supplied as an etching gas by amounts of 7 sccm, 7 sccm, 5 sccm, and 2 sccm, respectively.

Table 1 also shows comparative measurement results of an etching rate obtained for a case where conventional etching gases are used, that is, a mixture of $CH_4$ and $H_2$ supplied by amounts of 21 sccm and 6 sccm, respectively is used as an etching gas, and for a case where conventional etching gases are used, that is, a mixture of $Cl_2$ and Ar supplied by amounts of 7 sccm and 7 sccm, respectively, is used as an etching gas.

TABLE 1

| Material layer | $Cl_2$/Ar/$CH_4$/$H_2$ | $CH_4$/$H_2$ | $Cl_2$/Ar |
|---|---|---|---|
| InAlGaAs | 300-800 Å/min | <50 Å/min | 400-700 Å/min |
| InP | 300-800 Å/min | 300-400 Å/min | <450 Å/min* |
| Au | 100-500 Å/min** | <30 Å/min | 100-500 Å/min** |
| $SiO_2$ | 30-50 Å/min | — | 30-50 Å/min |
| SiNx | 400-700 Å/min | — | 400-700 Å/min |
| photoresist | >1000 Å/min | >1000 Å/min | >500 Å/min |

A process temperature for obtaining the results of Table 1 during each etching process is about 80° C. In Table 1, * represents a surface is rough and etching has been stopped, while ** represents surroundings of an etched surface has been contaminated by etching by-product particles.

Actually, an etching rate has changed much depending on a process temperature, a process pressure during an etching process, plasma density and a gas composition ratio within an etching chamber during each etching process for evaluations shown in Table 1. When a plasma of a mixture containing $Cl_2$, Ar, $CH_4$, and $H_2$ is used according to a method of the present invention, a $SiO_2$ mask is used as an etch mask, pressure within a reaction chamber is about 10 mtorr, temperature is room temperature, and plasma power density is about 1 watt/cm².

Evaluation Example 2

Figure 5:
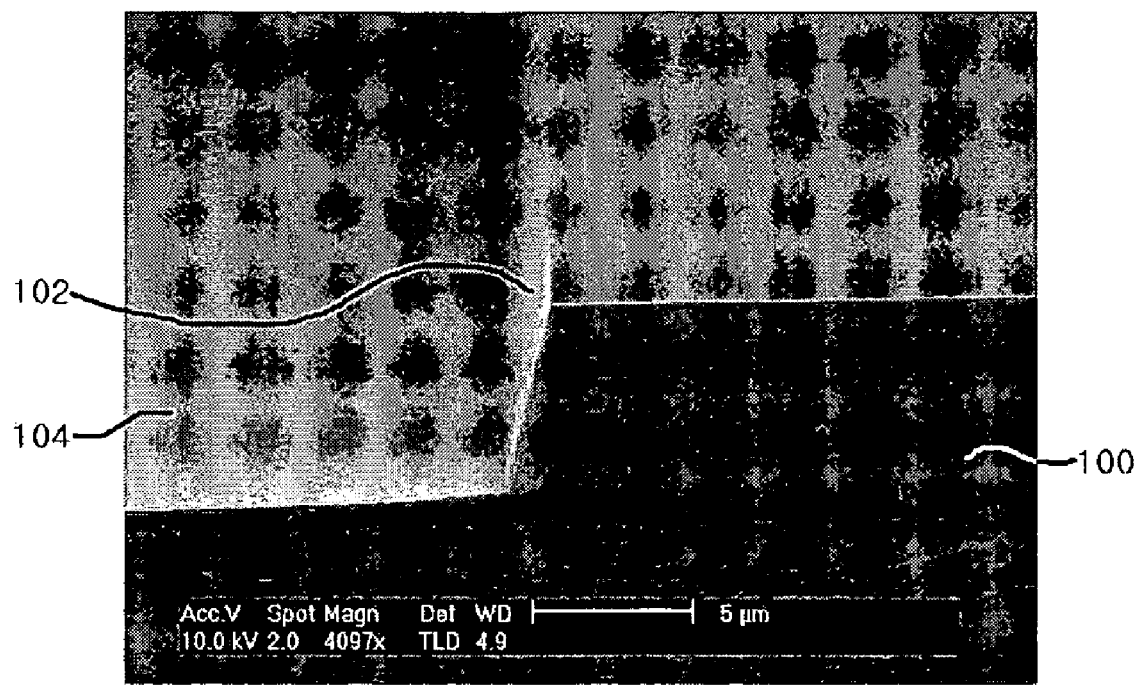
FIG. 5 is an SEM (scanning electron microscope) photo illustrating results obtained by etching a multi-layer stacked structure of InP/InAlGaAs using an etching method according to the present invention.

FIG. 5 is an SEM (scanning electron microscope) photograph illustrating results obtained by etching a multi-layer stacked structure of InP/InAlGaAs using a plasma of a mixture containing $Cl_2$, Ar, $CH_4$, and $H_2$ according to an etching method of the present invention. The same etching atmosphere as in the evaluation example 1 is provided in order to etch the multi-layer of InP/InAlGaAs. The result of FIG. 5 shows a cross-section of a stacked structure 100 including thirty three pairs of InP/InAlGaAs and etched to a thickness greater than about 5 μm from an upper surface of the stacked structure. At this point, an inclination of a sidewall 102 exposed by the etching is about 80° and an etched surface 104 is very clean and smooth.

In a method of manufacturing a VCSEL according to the present invention, a compound semiconductor layer having a multi-layered structure formed of semiconductors in groups III-V, particularly a multi-layer stacked structure based on InP/InAlGaAs is exposed to a plasma of a mixture containing $Cl_2$, Ar, $CH_4$, and $H_2$ when the multi-layer stacked structure is relatively etched deep, so that a very clean and smooth etched surface may be obtained. Particularly, etching may be performed up to a depth greater than about 10 μm, so that mass production of SEL may improve, manufacturing costs may reduce, a thermal characteristic of SEL can improve. Therefore, a device of high reliability may be realized.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An etching method for a multi-layered structure of semiconductors in groups III-V, the method comprising:

etching an exposed portion of a stacked structure completely through a lower InP/InAlGaAs multi-layered mirror and completely through an upper InP/InAlGaAs multi-layered mirror, the etching performed by using a plasma of a mixture consisting of $Cl_2$, Ar, $CH_4$, and $H_2$.

2. The method of claim 1, wherein said etching step also etches through a portion of a lower InP electrode layer, through an InP/InAlGaAs optical gain layer, and through an upper InP electrode layer.

3. The method of claim 1, wherein the mixture consists of $Cl_2$ between 1-99 volume %, Ar between 1-99 volume %, $CH_4$ between 1-99 volume %, and $H_2$ between 1-99 volume %, based on a total volume of the mixture.

4. The method of claim 3, wherein a $Cl_2$ to Ar volume ratio in the mixture is 1:1, and a $CH_4$ to $H_2$ volume ratio in the mixture is 5:2.

5. The method of claim 4, wherein a total volume of $Cl_2$ and Ar is the same as a total volume of $CH_4$ and $H_2$.

6. The method of claim 1, wherein the etching is performed in a pressure range of 1-100 mTorr.

7. The method of claim 1, wherein the etching is performed in a plasma power density range of 0.1-5 Watt/$cm^2$.

8. The method of claim 1, wherein the etching is performed in a temperature range of 0-150° C.

* * * * *